(12) United States Patent
Rebizant et al.

(10) Patent No.: US 11,495,969 B2
(45) Date of Patent: Nov. 8, 2022

(54) METHOD AND DEVICE FOR DETECTION OF SUB-SYNCHRONOUS OSCILLATIONS IN A POWER SYSTEM

(71) Applicant: SIEMENS AKTIENGESELLSCHAFT, Munich (DE)

(72) Inventors: Waldemar Rebizant, Wroclaw (PL); Hans-Joachim Herrmann, Markt Erlbach (DE); Sebastian Schneider, Oberasbach (DE); Pawel Regulski, Wroclaw (PL)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 17/186,231

(22) Filed: Feb. 26, 2021

(65) Prior Publication Data

US 2021/0265840 A1    Aug. 26, 2021

(30) Foreign Application Priority Data

Feb. 26, 2020 (EP) ..................................... 20159530

(51) Int. Cl.
*H02J 3/24* (2006.01)
*H02J 3/00* (2006.01)
*G01R 23/02* (2006.01)
*H02J 3/26* (2006.01)

(52) U.S. Cl.
CPC ............ *H02J 3/242* (2020.01); *G01R 23/02* (2013.01); *H02J 3/0012* (2020.01); *H02J 3/26* (2013.01)

(58) Field of Classification Search
CPC . H02J 3/0012; H02J 3/242; H02J 3/26; G01R 23/02

USPC ............................................................ 361/78
See application file for complete search history.

(56) References Cited

U.S. PATENT DOCUMENTS

| 4,218,718 A | * | 8/1980 | Sun .......................... H02H 7/06 361/113 |
| 9,806,690 B1 | | 10/2017 | Gong et al. |
| 2012/0303306 A1 | | 11/2012 | Orman et al. |

FOREIGN PATENT DOCUMENTS

WO    2011101097 A1    8/2011

* cited by examiner

*Primary Examiner* — Hal Kaplan
(74) *Attorney, Agent, or Firm* — Laurence A. Greenberg; Werner H. Stemer; Ralph E. Locher

(57) ABSTRACT

A method for detection of a sub-synchronous oscillation in a power system includes measuring a three-phase measurement signal of an electric system value, analyzing the measurement signal to detect an oscillation component of the measurement signal having an oscillation frequency lower than a system frequency of the power system, deciding whether the detected oscillation component at the oscillation frequency qualifies as a sub-synchronous oscillation, and disconnecting a generator from the power system that might be affected by the sub-synchronous oscillation. To detect sub-synchronous oscillations with low computational effort and good accuracy, an amplitude of each phase of the oscillation component is calculated and compared against a threshold, a sub-synchronous oscillation is detected upon exceeding the threshold during a given time delay, and a fault signal is generated upon detecting a sub-synchronous oscillation. A device having a processing unit is also provided.

8 Claims, 5 Drawing Sheets

METHOD AND DEVICE FOR DETECTION OF SUB-SYNCHRONOUS OSCILLATIONS IN A POWER SYSTEM

CROSS-REFERENCE TO RELATED APPLICATION

This application claims the priority, under 35 U.S.C. § 119, of European Patent Application EP 20159530.3, filed Feb. 26, 2020; the prior application is herewith incorporated by reference in its entirety.

BACKGROUND OF THE INVENTION

Field of the Invention

The invention relates to a method for detection of a sub-synchronous oscillation in a power system in which the following steps are performed: measuring a three-phase measurement signal of an electric system value, analyzing the measurement signal to detect an oscillation component of the measurement signal having an oscillation frequency that is lower than a system frequency of the power system, deciding whether the detected oscillation component at the oscillation frequency qualifies as a sub-synchronous oscillation, and disconnecting a generator from the power system that might be affected by the sub-synchronous oscillation. The invention also relates to a device for detection of a sub-synchronous oscillation in a power system.

Electric generators are being used to transform rotational energy into electric energy and feed a voltage having a specified frequency into a power system. Mechanical properties of a generator shaft interacting with electrical properties of the power system can lead to dangerous oscillations of the shaft in a frequency range below the system frequency (e.g. 50 Hz). Such a phenomenon is called "sub-synchronous resonance" (SSR) or "sub-synchronous oscillations." That phenomenon occurs when the natural frequency of the electrical power system is close to one of the natural modes of the shaft, which can lead to undamped oscillations of the shaft and eventually the shaft's damage. A typical source of the problem is line series compensation, but power converter controllers can also interact with the shaft modes. From a power system protection perspective, it is important to detect such a condition and disconnect the generator to prevent its damage.

Therefore, it is known to detect sub-synchronous oscillations in order to protect a generator. In International Publication WO 2011/101097A1, corresponding to U.S. Patent Application Publication No. 2012/0303306 A1, a demodulated voltage signal is calculated as a difference between the upper and lower voltage envelopes, and its RMS (root mean square) value is used to initially detect SSR. Once that happens, fast Fourier transform (FFT) is used to obtain more accurate information about the frequency and the amplitude of the component.

In U.S. Pat. No. 9,806,690 B1, an infinite impulse response (IIR) filter is used to remove the fundamental component and pass only the sub-synchronous range between 5-55 Hz (configured for a 60 Hz system). Then, a continuous RMS method is used to obtain the signal level for further processing. That solution does not offer estimation of the dominant SSR frequency.

BRIEF SUMMARY OF THE INVENTION

It is accordingly an object of the invention to provide a method and a device for detection of sub-synchronous oscillations in a power system, which overcome the hereinafore-mentioned disadvantages of the heretofore-known methods and devices of this general type and which do so with low computational effort and with good accuracy.

With the foregoing and other objects in view there is provided, in accordance with the invention, a method for detection of a sub-synchronous oscillation in a power system, in which an amplitude of each phase of the oscillation component is calculated and compared against a threshold, a sub-synchronous oscillation is detected when the threshold is exceeded during a given time delay, and a fault signal is generated if a sub-synchronous oscillation has been detected.

Through the use of the inventive method, the dominant SSR component ("oscillation component") can be easily isolated and further analyzed.

According to an advantageous embodiment of the method, the amplitude of each phase of the oscillation component is calculated using an adaptive notch (AN) filter.

Typically, such an adaptive notch filter is used for frequency tracking, amplitude estimation and noise cancellation. A good accuracy of the proposed solution is achieved by using an AN filter, which further isolates the dominant SSR component by filtering out other components, possibly not related to any SSR event. The AN filter also allows for frequency estimation, which in turn can be used to adapt the RMS window length. The AN filter can be a $2^{nd}$ order IIR filter, which means it has fixed computational requirements (window length does not change) and the computational burden is much lower when compared to a FIR filter of similar characteristic.

According to another advantageous embodiment of the method each phase of the oscillation component is checked for a transient state by calculating a rate of change of an amplitude of a fundamental component of the measurement signal, and if a transient state is detected for at least one phase, the generation of the fault signal is blocked.

According to another advantageous embodiment of the method the oscillation component is checked for an asymmetry state by comparing the phase of the oscillation component having a maximum value with the phase of the oscillation component having a minimum value, and if an asymmetry state has been detected, the generation of the fault signal is blocked.

Thus, the proposed decision logic has up to two optional blocking conditions to ensure security from misoperation—transient blocking and asymmetry check. This ensures a high degree of safety during unrelated events (i.e. not SSR relevant events), such as transients, power oscillations or energization of a nearby transformer.

According to another advantageous embodiment of the method the generator is disconnected from the power system by opening a circuit breaker, if the fault signal is present.

Thus, the generator can be properly prevented from any damage.

Finally, according to another advantageous embodiment of the claimed method the electric system value is an electric current or an electric voltage present at a measurement location of the power system.

With the objects of the invention in view there is also provided a device for detection of a sub-synchronous oscillation in a power system, having a measurement unit for measuring a three-phase measurement signal of an electric system value, a processing unit for analyzing the measurement signal to detect an oscillation component of the measurement signal having a fundamental frequency that is lower than a system frequency of the power system and deciding whether the detected oscillation component at the fundamental frequency qualifies as a sub-synchronous oscillation, and a command interface for outputting a signal to disconnect a generator from the power system that might be affected by the sub-synchronous oscillation.

According to the invention the processing unit is configured to perform a method according to the invention.

The device can be a stand-alone device or can be part of an electric protection device for monitoring and protecting the electric power system.

Other features which are considered as characteristic for the invention are set forth in the appended claims.

Although the invention is illustrated and described herein as embodied in a method and a device for detection of sub-synchronous oscillations in a power system, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL
VIEWS OF THE DRAWING

DETAILED DESCRIPTION OF THE
INVENTION

Figure 1:
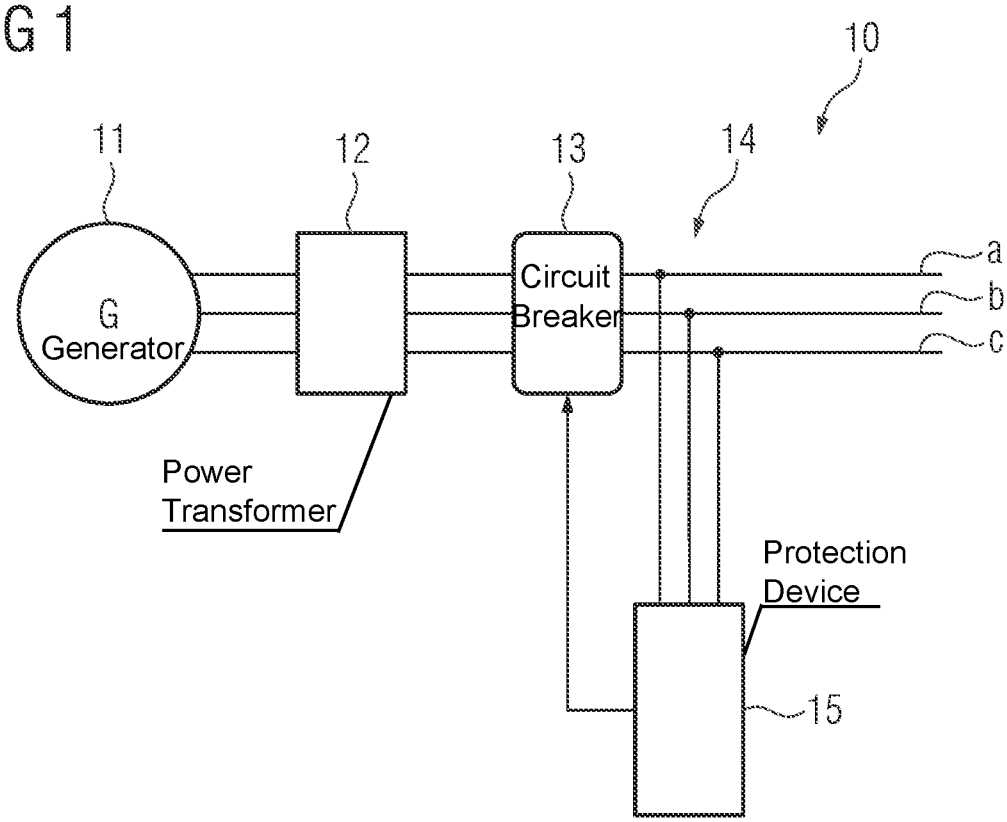
FIG. 1 is a block diagram showing an overview of a part of a power system with a generator and a device for detection of sub-synchronous oscillations.

Referring now in detail to the figures of the drawings, in which similar or identical elements may be provided with the same reference signs, and first, particularly, to FIG. 1 thereof, there is seen a schematic overview of a part of a three-phase power system 10. A generator 11 transforms rotational energy into electrical energy and applies a voltage to phases a, b, c of the power system 10. A power transformer 12 may be used to adapt the voltage to a required voltage level. A circuit breaker 13 is installed to connect the generator 11 to or disconnect it from the remainder of the power system 10. An electric system value (e.g. a three-phase voltage or a three-phase current) is measured at a measurement location 14 and a respective three-phase measurement signal is produced and fed to a protection device 15, which may be a stand-alone protection device for detecting sub-synchronous oscillations only, or may be a multi-purpose protection device that also performs several other protection functions for the power system (e.g. over-current protection, over-voltage protection, distance protection, etc.). The protection device 15 contains a measurement unit to receive and pre-process the measurement signal. The protection device further contains a processing unit to analyze the measurement signal and to detect a possible sub-synchronous oscillation, and a command interface to transmit a tripping signal to the circuit breaker 13 in order to disconnect the generator 11 from the remaining power system 10.

Referring now to FIGS. 2 to 8, it will be explained in more detail, how the detection of a sub-synchronous oscillation (SSR) is performed.

Figure 2:
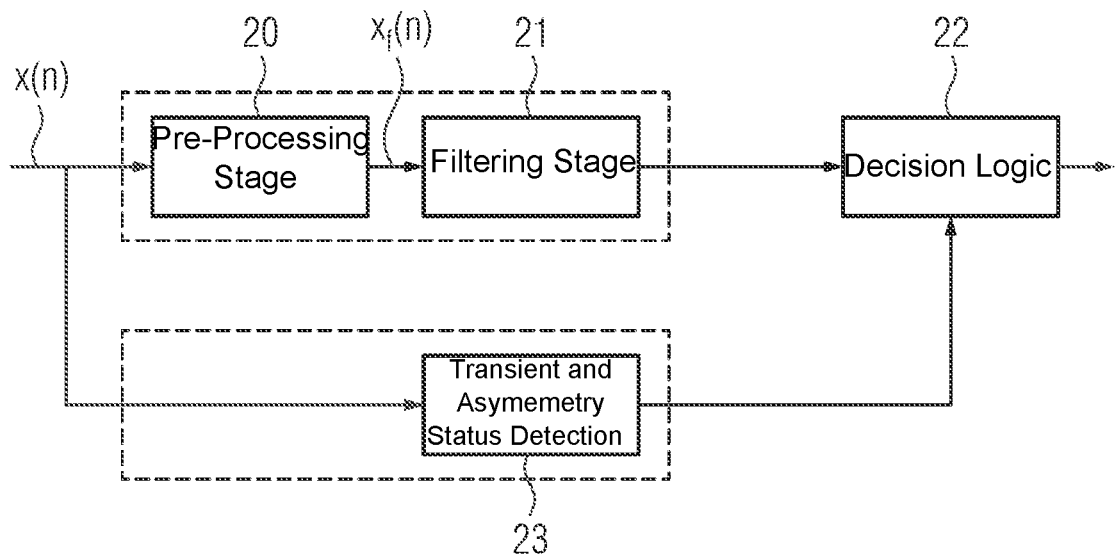
FIG. 2 is a simplified block diagram of steps of a method for detection of sub-synchronous oscillations.

A general overview of the proposed SSR protection scheme is depicted in FIG. 2. The proposed SSR protection scheme is formed of three stages: a pre-processing stage 20, a filtering stage 21 and a decision logic 22. The decision may optionally be stabilized against unwanted errors during the SSR-detection by a transient status detection and an asymmetry status detection, both are only schematically depicted as a block 23 in FIG. 2 and will be explained in more detail below.

Figure 3:
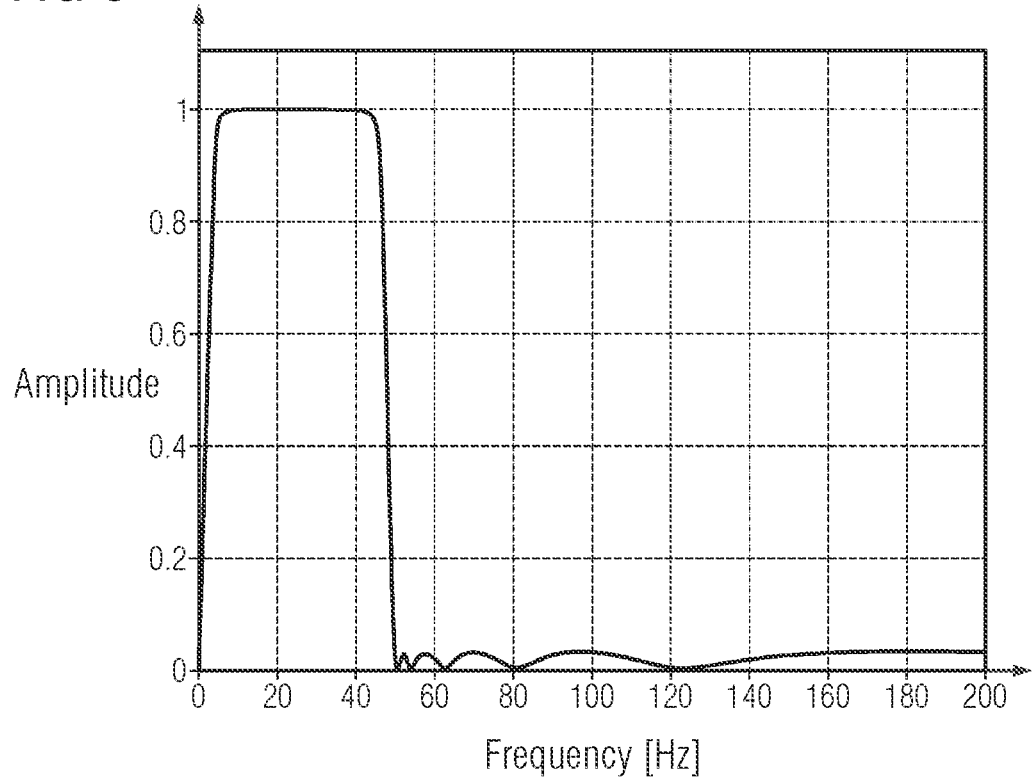
FIG. 3 is a diagram showing an exemplary filtering characteristic of a pre-processing filter.

In FIG. 2, a measurement signal x(n) is fed to the pre-processing stage 20 which is implemented as a digital filter. The pre-processing filter is a combination of a high-pass filter (e.g. Butterworth 3rd order) and a lowpass filter (e.g. Chebyshev type II 12th order). An exemplary filter characteristic of the pre-processing filter is depicted in FIG. 3.

Figure 4:
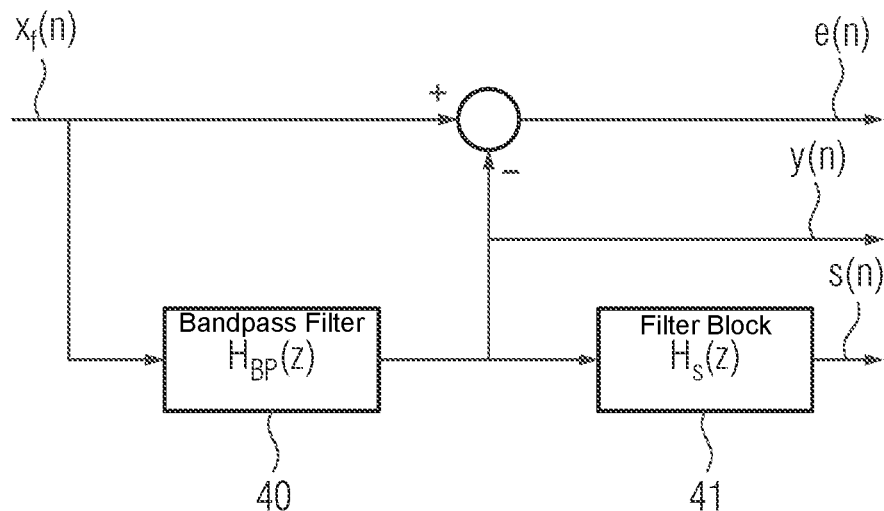
FIG. 4 is a block diagram showing an exemplary structure of a digital adaptive notch filter.

In the second stage 21, the output xf(n) of the first stage 20 is fed into an adaptive notch (AN) filter. Typically, these filters are used for frequency tracking, amplitude estimation and noise cancellation. For the purpose of SSR detection, a digital AN filter has been adopted, and its general structure is depicted in FIG. 4.

The input signal xf(n) goes through a bandpass filter 40 having a transfer function HBP(z) and three outputs are obtained: the error e(n), the isolated component y(n) having the dominant SSR frequency ("oscillation component") and the sensitivity s(n) obtained through the transfer function HS(z) of a filter block 41. Detailed formulas are presented below:

$$H_{BP}(z) = \frac{k_2(1-z^{-2})/2}{1-(1-k_2-k_1^2)z^{-1}+(1-k_2)z^{-2}} \quad (1)$$

$$H_S(z) = \frac{2k_1 z^{-1}}{1-(1-k_2-k_1^2)z^{-1}+(1-k_2)z^{-2}} \quad (2)$$

$$s(n) = \frac{\partial y(n)}{\partial k_1} \quad (3)$$

Parameter $k_1$ is controlling the central frequency of the AN filter $f_0$ and it can be adapted recursively using the following formulas:

$$k_1(n+1) = k_1(n) - \mu e(n) \frac{s(n)}{v(n)} \quad (4)$$

$$v(n) = v(n-1)\lambda + (1-\lambda)s^2(n) \quad (5)$$

where μ and λ are tuning parameters.

Now that the parameter $k_1$ is updated at each step to track the dominant SSR frequency of the signal, that frequency can be calculated as follows:

$$f(n) = \frac{\theta(n)f_s}{2\pi} \quad (6)$$

$$\theta(n) = 2\sin^{-1}\left\{\frac{k_1(n)}{2\sqrt{1-k_2/2}}\right\} \quad (7)$$

where $f_s$ is the sampling frequency.

The amplitude SSR_A(n) of the isolated component y(n) can be obtained directly from the signal y(n) using an RMS window. For increased accuracy, the value of the estimated frequency is used to adapt the window length:

$$\text{SSR\_A}(n) = \sqrt{\frac{2}{N_{RMS}(n)}\sum_{m=0}^{N_{RMS}(n)-1} y^2(n-m)} \quad (8)$$

$$N_{RMS}(n) = \text{round}(N_C f_s / f(n)) \quad (9)$$

where $N_c$ is the number of full cycles used in the amplitude calculation (e.g. the value of 2 cycles can be used). The values of parameters $k_1$ and $k_2$ are initialized as follows:

$$k_1 = 2\sqrt{1-k_2/2}\sin(\pi f_0/f_s) \quad (10)$$

$$k_2 = 1 - r^2 \quad (11)$$

where r is a parameter controlling the bandwidth of the AN filter. Stable filters require values below 1. The value of $k_1$ is then adapted, but the value of $k_2$ remains constant.

Additionally, to improve the stability of filter adaptation, the range of adaptation is bounded. For example, a 10 Hz range can be chosen (with a central frequency $f_0$ in the middle) and the corresponding values of minimum and maximum allowed values of parameter $k_1$ are obtained. An additional check ensures that the adapted value $k_1$ stays within this range. It should be noted that the input signals of the algorithm ("electric system value"), whether currents or voltages, are expected to be in per unit system.

As mentioned with regard to FIG. 2, a stabilization of the decision making process can be achieved by i.a. checking whether there exists a transient system state. In order to determine a transient system state, the measurement signal x(n) has to be further processed to calculate a rate of change ROC_FC_A(n) of the amplitude of the fundamental frequency component ("fundamental component") of the power system. The amplitude of the fundamental component can be obtained using a pair of sine and cosine windows:

$$a_s(k) = \sin\left[\left(\frac{lN_1-1}{2} - k\right)\Omega\right] \quad (12)$$

$$a_c(k) = \cos\left[\left(\frac{lN_1-1}{2} - k\right)\Omega\right] \quad (13)$$

$$N_1 = \frac{f_s}{f_1} \quad (14)$$

$$\Omega = \frac{2\pi f_1}{f_s} \quad (15)$$

where l is the window length in number of cycles of the fundamental component, $f_1$ is the frequency of the fundamental component and $0 \le k \le lN_1 - 1$. In order to achieve immunity to any possible sub-synchronous components it is recommended to use l=8. Additionally, the frequency response of the filter can be smoothened with a Hanning window:

$$w(k) = 0.5\left[1 - \cos\left(\frac{2\pi k}{lN_1 - 1}\right)\right] \quad (16)$$

where $0 \le k \le lN_1 - 1$. For a given input signal x(n) the output of the filters can be calculated as follows:

$$y_s(n) = \frac{4}{lN_1}\sum_{k=0}^{lN_1-1} x(n-k)a_s(k)w(k) \quad (17)$$

$$y_c(n) = \frac{4}{lN_1}\sum_{k=0}^{lN_1-1} x(n-k)a_c(k)w(k) \quad (18)$$

Then, the amplitude of the fundamental component can be calculated as follows:

$$\text{FC\_A}(n) = \sqrt{y_s^2(n) + y_n^2(n)} \quad (19)$$

Finally, the rate of change of the amplitude of the fundamental component can be obtained simply as:

$$\text{ROC\_FC\_A}(n) = \text{FC\_A}(n) - \text{FC\_A}(n-1))f_s \quad (20)$$

The third stage of the algorithm depicted in FIG. 2 is the decision logic 22. In one favorable embodiment, three parallel logical blocks are implemented within the decision logic: SSR pickup (see FIG. 5), transient system state blocking (see FIG. 6) and SSR asymmetry check (see FIG. 7). The outputs of these logical blocks are then combined to produce the final decision as depicted in FIG. 8.

Figure 5:
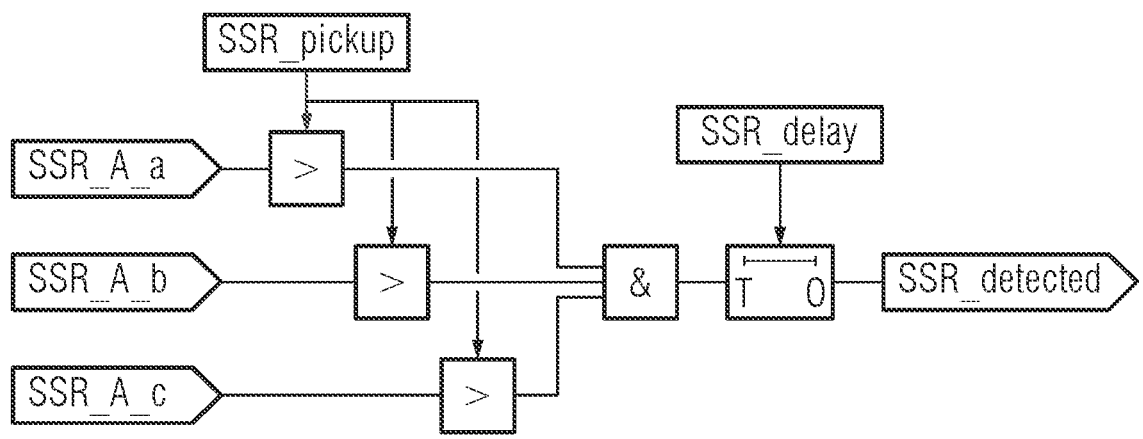
FIG. 5 is a diagram showing a detailed view of an exemplary decision logic for detecting sub-synchronous oscillations.

Two sets of three phase signals have been used for the logic input. The first one is the estimated amplitude of the SSR component in each phase calculated as in equation (8):

SSR_A_a,

SSR_A_b,

SSR_A_c, all of them in per unit. The second set is the estimated rate of change of amplitude of the fundamental component in each phase calculated as in equation (20):

ROC_FC_A_a,

ROC_FC_A_b,

ROC_FC_A_c, all of them in per unit. As can be seen in FIG. 5, the SSR pickup element is responsible for detecting abnormal SSR levels (SSR_pickup) and producing an appropriate output signal when the condition holds in all three phases for a predefined amount of time (SSR_delay).

Figure 6:
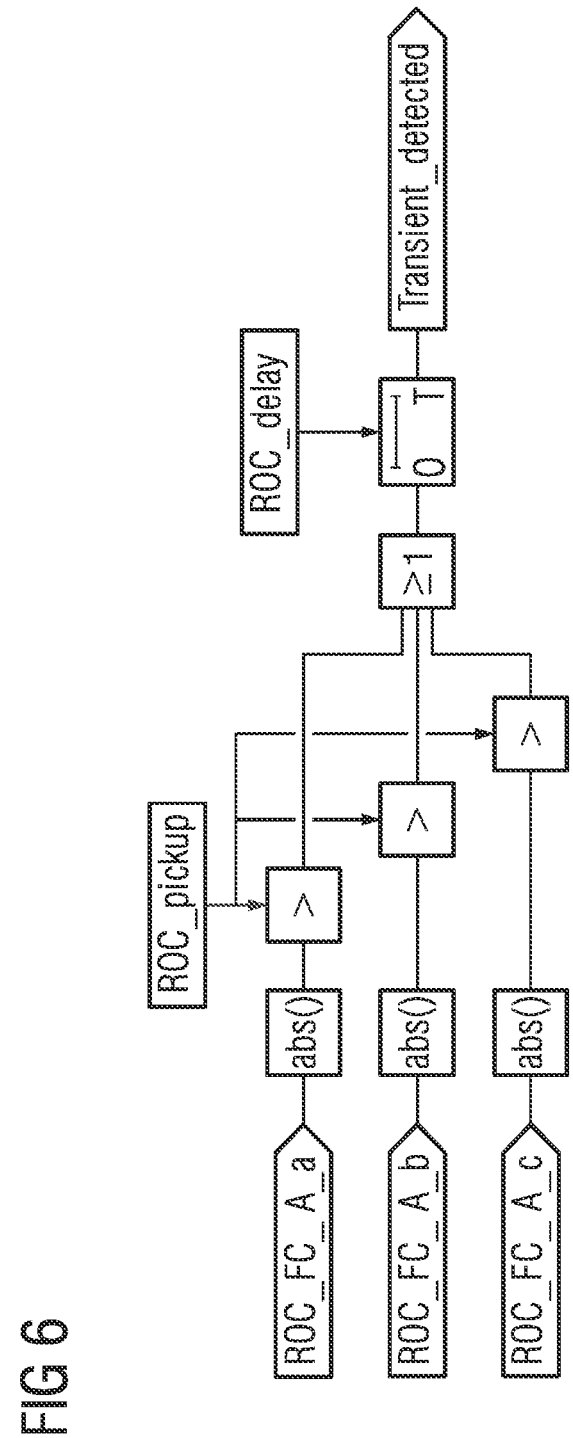
FIG. 6 is a diagram showing a detailed view of an exemplary decision logic for detecting a transient system status.
Figure 7:
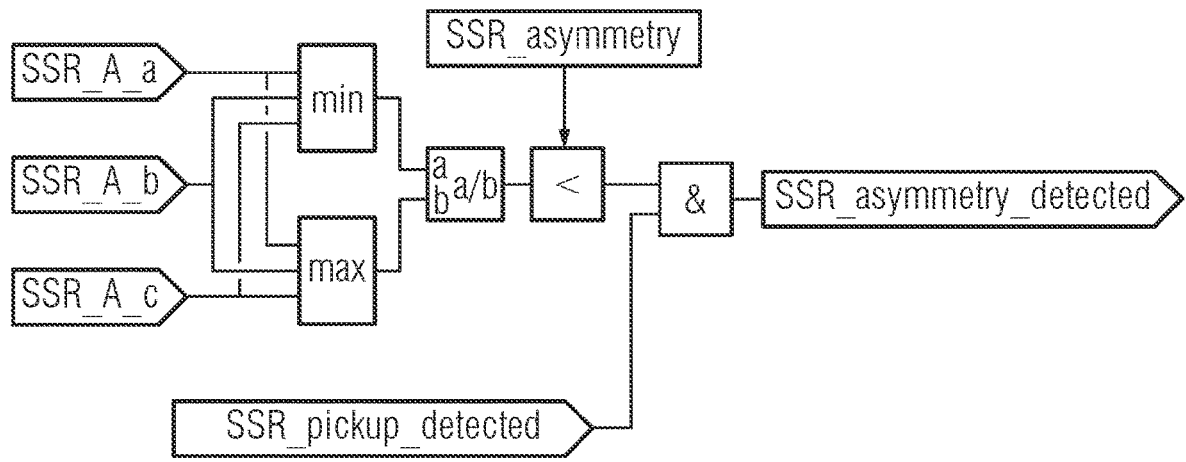
FIG. 7 is a diagram showing a detailed view of an exemplary decision logic for detecting an asymmetry status.
Figure 8:
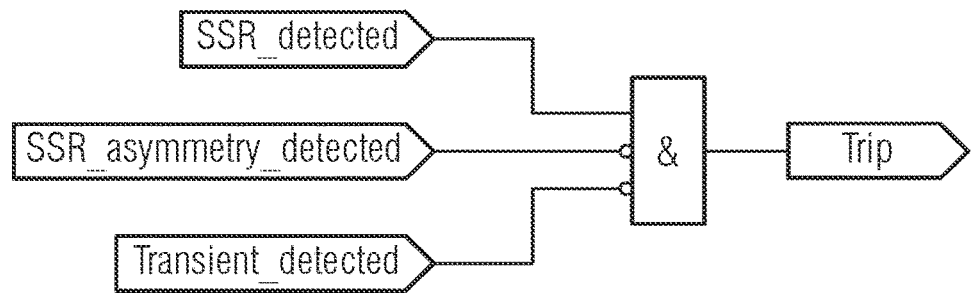
FIG. 8 is a diagram showing an exemplary decision logic respectively combining the detection of sub-synchronous oscillations with the detection of a transient system status and an asymmetry status.

The SSR detection can be stabilized by the transient system state blocking scheme and the asymmetry state blocking scheme as depicted in FIGS. 6 and 7.

As can be seen in FIG. 6, the transient blocking element is responsible for detecting a condition, in which the absolute value of the estimated rate of change of amplitude of the fundamental component is above a predefined threshold (ROC_pickup) in at least one phase. The output signal is held for a predefined amount of time (ROC_delay) using a dropout delay.

As can be further seen in FIG. 7, the SSR asymmetry check element ensures that that the estimated amplitudes of the SSR component in all three phases have similar values. The ratio of minimum to maximum value at each time instant is compared with a predefined setting (SSR_asymmetry). A setting of 1 means that the estimated amplitudes need to be identical and any smaller setting will allow for some level of asymmetry (e.g. a setting of 0.95 means that 5 asymmetry is allowed).

The output of all three elements is combined to produce the final decision, as can be seen in FIG. 8. The protection will operate only if SSR component is detected and at the same time no transient is detected and the SSR asymmetry is at an acceptable level (no major asymmetry).

The proposed solution provides a good accuracy of the SSR estimation with relatively low computational requirements and the decision logic provides secure operation of the protection. A good accuracy of the proposed solution is achieved through the use of an AN filter, which further isolates the dominant SSR component by filtering out other components, possibly not related to any SSR event. The filter also allows for frequency estimation, which in turn can be used to adapt the RMS window length. The AN e.g filter is a 2nd order IIR filter, which means it has fixed computational requirements (window length does not change) and the computational burden is much lower when compared to a FIR filter of similar characteristic. The proposed decision logic optionally has two blocking conditions to ensure security from misoperation: a transient blocking and an asymmetry check. This ensures a high degree of safety during unrelated events, such as transients, power oscillations or energization of a nearby transformer.

The proposed solution can be used both in stand-alone devices as well as in a multi-purpose protection device. In the latter case the decision logic can complement e.g. any existing generator protection.

Although the present invention has been described in detail with reference to the preferred embodiment, it is to be understood that the present invention is not limited by the disclosed examples, and that numerous additional modifications and variations could be made thereto by a person skilled in the art without departing from the scope of the invention.

It should be noted that the use of "a" or "an" throughout this application does not exclude a plurality, and "comprising" does not exclude other steps or elements. Also, elements described in association with different embodiments may be combined. It should also be noted that reference signs in the claims should not be construed as limiting the scope of the claims.

The invention claimed is:

1. A method for detection of a sub-synchronous oscillation in a power system, the method comprising:

measuring a three-phase measurement signal of an electric system value;

analyzing the measurement signal to detect an oscillation component of the measurement signal having an oscillation frequency being lower than a system frequency of the power system;

deciding whether the detected oscillation component at the oscillation frequency qualifies as a sub-synchronous oscillation;

disconnecting a generator from the power system that might be affected by the sub-synchronous oscillation;

calculating an amplitude of each phase of the oscillation component and comparing the amplitude of each phase against a respective threshold;

detecting a sub-synchronous oscillation upon the amplitude of one or more phases of the oscillation component exceeding the threshold during a given time delay; and generating a fault signal upon detecting a sub-synchronous oscillation.

2. The method according to claim 1, which further comprises using an adaptive notch filter to calculate the amplitude of each phase of the oscillation component.

3. The method according to claim 1, which further comprises:

checking each phase of the oscillation component for a transient state by calculating a rate of change of an amplitude of a fundamental component of the measurement signal; and blocking the generation of the fault signal upon detecting a transient state for at least one phase.

4. The method according to claim 1, which further comprises:

checking the oscillation component for an asymmetry state by comparing a phase of the oscillation component having a maximum value with a phase of the oscillation component having a minimum value; and blocking the generation of the fault signal upon detecting an asymmetry state.

5. The method according to claim 1, which further comprises disconnecting the generator from the power system by opening a circuit breaker when a fault signal is present.

6. The method according to claim 1, which further comprises providing the electric system value as an electric current or an electric voltage present at a measurement location of the power system.

7. A device for detection of a sub-synchronous oscillation in a power system, the device comprising:

a processor for measuring and analyzing a three-phase measurement signal of an electric system value to detect an oscillation component of the measurement signal having an oscillation frequency being lower than a system frequency of the power system and deciding whether the detected oscillation component at the oscillation frequency qualifies as a sub-synchronous oscillation, said processing unit being configured to perform the method according to claim 1; and a command interface for outputting a signal to disconnect a generator from the power system that might be affected by the sub-synchronous oscillation.

8. The device according to claim 7, wherein the device is part of an electric protection device for monitoring and protecting the electric power system.

* * * * *